July 18, 1967 — FUJIO SUGANUMA — 3,332,027

OUTPUT TRANSISTOR PROTECTING SYSTEM
IN A TRANSISTOR AMPLIFIER CIRCUIT

Filed Aug. 20, 1963 — 2 Sheets-Sheet 1

INVENTOR.
Fujio Suganuma
BY
Pierce, Schiffler & Parker
attorneys

INVENTOR
FUJIO SUGANUMA

United States Patent Office 3,332,027 Patented July 18, 1967

3,332,027

OUTPUT TRANSISTOR PROTECTING SYSTEM IN A TRANSISTOR AMPLIFIER CIRCUIT

Fujio Suganuma, Tokyo, Japan, assignor to TDK Electronics Company, Limited, and Toyo Music Broadcasting Company, Limited, both of Tokyo, Japan, both corporations of Japan Filed Aug. 20, 1963, Ser. No. 303,302
Claims priority, application Japan, Aug. 28, 1962, 37/36,776
6 Claims. (Cl. 330—13)

This invention relates to an output transistor protecting system for preventing transistors from being ruined by an excess input, electric pulse input or load short-circuiting in a transistor amplifier output circuit.

Various circuits have been already suggested for such kind of output transistor protecting system. However, if a resistor or the like is inserted in the output circuit to protect the transistor, the transistor will be protected but with an undesirable reduction in the characteristics of the circuit of the transistor. The present invention is suggested to eliminate the above mentioned defect.

A principal object of the present invention is to provide an output transistor protecting system wherein an operating current flowing to both the amplifying transistor and the output transistor can be so restricted that the flow is not above the value required for the maximum normal outputs of said transistors and the transistors can be perfectly prevented from being damaged by an excess input, electric pulse input or load short-circuiting without influencing the normal amplifying action and other characteristics.

An embodiment of the present invention shall now be explained with reference to the drawings. FIGURES 1, 2, 3, 5, 6 and 7 show protective resistor of the present invention as applied to output circuits for transistorized audio frequency amplifiers.

Figure 1:
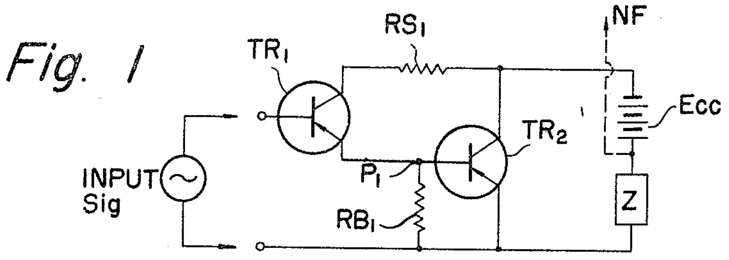
FIGURE 1 shows an embodiment of the present invention.

In FIGURE 1, a protective resistor $RS_1$ is provided between the respective collectors of a PNP type front stage transistor $TR_1$ and a PNP type rear stage transistor $TR_2$. That is to say, an input signal is applied to the base and emitter of the front stage transistor $TR_1$ through the rear stage transistor $TR_2$ and a resistor $RB_1$. The emitter of the front stage transistor $TR_1$ and the base of the rear stage transistor $TR_2$ are connected with each other. The resistor $RB_1$ is connected between the emitter and base of the rear transistor $TR_2$. A protective resistor $RS_1$ is inserted between the respective collectors of the transistors $TR_1$ and $TR_2$. The minus side of a battery is connected to the collector of the transistor $TR_2$. The plus side of the battery is connected to the emitter of the transistor $TR_2$ through load Z.

Figure 2:
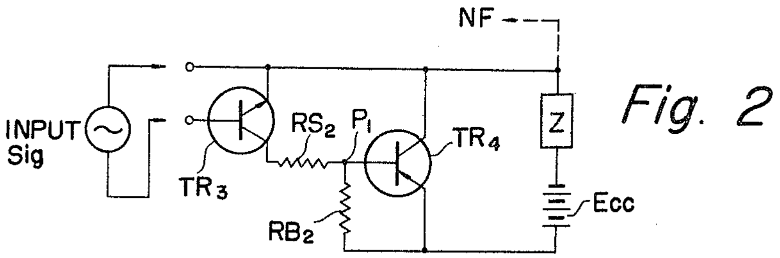
FIGURES 2, 3, 5, 6 and 7 show other embodiments of the present invention.

In the circuit shown in FIGURE 2, a protective resistor $RS_2$ is inserted and provided between the collector of an NPN type front stage transistor $TR_3$ and the connecting point $P_1$ of a shunt resistor $RB_2$ connected to the base of a PNP type rear stage transistor $TR_4$. That is to say, the emitter of the transistor $TR_3$, the collector of the transistor $TR_4$ and a load Z are connected with one another, an input signal is applied between the base and emitter of the transistor $TR_3$ and a protective resistor $RS_2$ is inserted between the connecting point $P_1$ of the base of the transistor $TR_4$ and the shunt resistor $RB_2$ and the collector of the transistor $TR_3$. A load and a battery are connected in series between the emitter and collector of the transistor $TR_4$. The plus side of the battery is connected to the emitter of the transistor $TR_4$ and the minus side of the battery is connected to the collector of the transistor $TR_4$ through the load.

Figure 3:
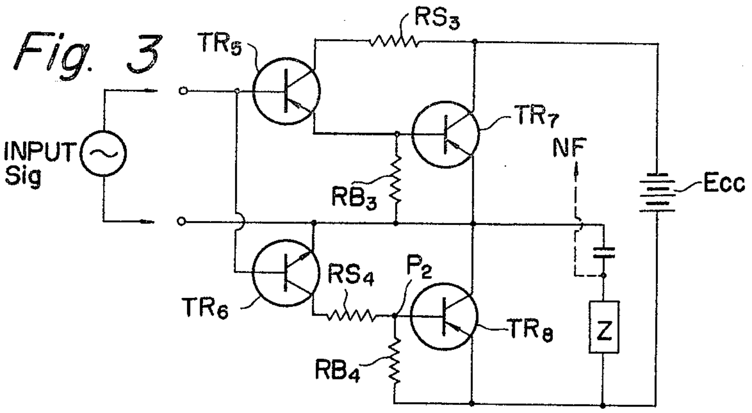

FIGURE 3 shows a single ended push-pull circuit made by combining the circuits shown in FIGURES 1 and 2. A protective resistor $RS_3$ is inserted and provided between the respective collectors of a PNP type front stage transistor $TR_5$ and a PNP type rear stage transistor $TR_7$. A protective resistor $RS_4$ is inserted between a front stage NPN type transistor $TR_6$ and the connecting point $P_2$ of a shunt resistor $RB_4$ connected to the base of a PNP type rear stage transistor $TR_8$.

The present invention is based on the following idea. The damage to a transistor is due to an excess current. In order to prevent damage to the transistor $TR_1$, any excess current above the normal value may be prevented from flowing to the transistor $TR_1$. The same can be said of the transistor $TR_2$.

In the Darlington circuit in FIGURE 1, if $Ib_2$ is a base current of the transistor $TR_2$, $Ie_1$ is an emitter current of the transistor $TR_1$ and $Ic_1$ is a collector current of the transistor $TR_1$, the $Ie_1$ is, in an accurate sense, the sum of $Ib_2$ and a current ($I_{RB}$) flowing through the resistor $RB_1$, and $Ic_1$ is equal to the balance of $Ie_1$ from which a base current of the transistor $TR_1$ is deducted.

$$Ic_1=Ie_1-Ib_1,\ Ie_1=Ib_2+I_{RB}$$

But the currents $Ib_1$ and $I_{RB}$ can be considered to be of a very small value in practical uses. Therefore, $$Ic_2 \doteqdot Ie_1 \doteqdot Ic_1 \qquad (1)$$

Therefore, in the output transistor $TR_2$, in order to prevent the collector current $Ic_2$ from exceeding the maximum collector current $Ic_2$ max. required for the maximum normal output the base current $Ib_2$ may be controlled to not exceed the maximum base current $Ib_2$ max. of the transistor $TR_2$ required therefor. In order to restrict the base current $Ib_2$, the emitter current $Ie_1$ or the collector current $Ic_1$ may be restricted by the Formula 1. Therefore, in FIGURE 1, if the current $Ic_1$ or $Ie_1$ is restricted so as not to exceed the maximum current $Ib_2$ max. required by the transistor $TR_2$ for the maximum normal output, the transistors $TR_1$ and $TR_2$ will be protected from being ruined by an excess input, electric pulse input of load short-circuiting.

In the circuit in FIG. 1, when the protective resistor $RS_1$ is not inserted the load characteristic of the transistor $TR_1$ is represented by such load line as is shown in FIG. 4(B), but the load characteristic can be made to be as represented by the load line in FIG. 4(A) by inserting the protective resistor $RS_1$ into said circuit.

Even if the collector current $Ic_1$ of the transistor $TR_1$ is to increase excessively, due to the voltage drop by the protective resistor $RS_1$, the collector voltage $Ec_1$ of the transistor $TR_1$ will drop and will become substantially zero at the maximum collector current required for the transistor $TR_1$, therefore the collector current $Ic_1$ will no more increase and the transistor $TR_1$ will be protected from being damaged by the excess input and pulse input. At the same time, as described above, as $Ic_1 \doteqdot Ib_2$, the base current $Ib_2$ of the transistor $TR_2$ will not increase to be more than the specified value $Ib_2$ max. ($\doteqdot Ic_1$ max.), therefore the collector current $Ic_2$ will also not be more than the specified value and the transistor $TR_2$ will be also protected from being damaged.

Further, in case a negative feedback is applied to the front stage transistor from the output terminal as shown by the broken line in FIGURE 1, if the output load is short-circuited and an excess current flows to the transistor $TR_2$, the base current $Ib_2$ will also increase and, as $$Ib_2 \doteqdot Ic_1 \qquad (3)$$

the collector current $Ic_1$ will also increase. However, as described above, said collector current $Ic_1$ will be restricted by the protective resistor $RS_1$ and will not exceed the normal value. Therefore, even if the load is short-circuited, the collector current $Ic_2$ also will not exceed the normal value. Thus both transistors $TR_1$ and $TR_2$ will be protected from being damaged.

As regards the influence of the protective resistor RS in the normal operating condition, it is likely to be thought, when the resistor RS is inserted in the collector of the transistor $TR_1$, the voltage fluctuation of the transistor $TR_1$ will become so large as to give a bad influence on the normal operation. However, if the operation of the transistors $TR_1$ and $TR_2$ is considered in the light of the new idea of the present invention based on the concept that the operation of the transistor depends entirely on the current only and that, in the Darlington circuit, though the transistor acts singly, it can be fed with currents from two current sources. It will be found that, as the resistor $RS_1$ is inserted, when an input is applied to the transistor $TR_1$, the voltage between the collector and emitter of the transistor $TR_1$ will naturally be reduced. But as seen in the load characteristic in FIG. 4(A) even when the voltage between the collector and emitter of the transistor $TR_1$ is the lowest, the current is maximum. Further, in the transistor $TR_2$, as described above, the base current $Ib_2$ ($=Ic_1$) will not be influenced by the protective resistor $RS_1$, the collector current $Ic_2$ can be fed from another current source than of the transistor $TR_1$ and therefore the collector current $Ic_2$ will be independent of the protective resistor $RS_1$ and will have no influence on the output of the transistor $TR_2$. As a result, only when the normal value is exceeded, the protective resistor $RS_1$ will operate and will act as a limiter. But it will have no influence at all on the normal operation. Said protective resistor $RS_1$ is inserted and provided on the collector side of the transistor $TR_1$ because the operating condition of the original circuit will not be varied by the insertion of the protective resistor $RS_1$ there. If the protective resistor $RS_1$ is inserted and provided on the emitter side of the transistor $TR_1$, the input impedance of the transistor $TR_1$ will become higher than before the insertion and the operating condition will be different from that of the original circuit. Further, if the protective resistor is inserted and provided on the base side of the transistor $TR_2$, the impedance connected between the base and emitter of the transistor $TR_2$ will rise, therefore the voltage ($V_{CER}$) will reduce between the collector and emitter, the same not being desirable. However, when the protective resistor $RS_1$ is inserted and provided on the collector side, all above mentioned defects will be eliminated. However, in case the input impedance is desired from the first to be higher than in the circuit of the embodiment in FIGURE 1, the protective resistor $RS_1$ may be inserted and provided on the emitter side of the transistor $TR_1$.

Figure 4:
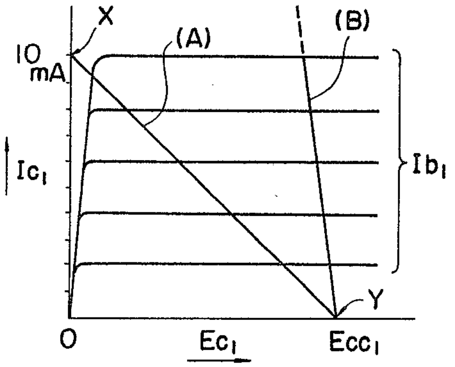
FIGURE 4 is an explanatory diagram for setting the value of a protective resistance to be used in the system of the present invention.

A method of setting the resistance value of the protective resistor RS of the present invention shall be explained by means of FIGURE 4. In the diagram of $Ec$–$Ic$ characteristics in which the abscissa represents the collector voltage $Ec_1$ of the transistor $TR_1$ and the ordinate represents the collector current $Ic_1$ of the transistor $TR_1$, now if the value of the base current $Ib_2$ required for the output transistor $TR_2$ to develop the maximum normal output is 10 ma., as the emitter of the amplifying transistor $TR_1$ and the base of the output transistor $TR_2$ are directly connected as mentioned before, the maximum collector current $Ic_1$ of the amplifying transistor $TR_1$ required for the output transistor $TR_2$ to develop the maximum normal output will be, from the Equation 1, 10 ma. Further, if the load line according to the load resistance RL (a parallel value of the resistor $RB_1$ and input resistance of the output transistor $TR_2$) and the collector voltage $Ecc_1$ fed into the amplifying transistor $TR_1$ will be as shown by B in FIG. 4, the current $Ic_1$ on the load line will be enough to be within the range not exceeding 10 ma. which the value will be enough to obtain the maximum output, and any current more than that will not be required. It is, therefore, necessary only to make the collector voltage zero when the current $Ic_1$ flowing through the amplifying transistor $TR_1$ is 10 ma. so that no current more than that will flow. In other words, it is only necessary to obtain an operation characteristic as shown by A in FIG. 4 of the load line.

Therefore, the load line value RL' then will be $$RL'=Ecc_1/Ic_{max} \quad (4)$$

and the value of the protective resistor $RS_1$ will be $$RS_1=RL'-RL \quad (5)$$

This is the resistance value of the protective resistance $RS_1$.

The present invention has the above mentioned operating principle. As shown in the embodiment in FIGURE 2, in the Darlington circuit in which the front input transistor is the NPN type transistor $TR_3$, when the protective resistor $RS_2$ is inserted and provided between the collector of the transistor $TR_3$ and the connecting point $P_1$ of the shunt resistor $Rb_2$ connected to the base of the PNP type transistor $TR_4$, the same as in the above described case that the resistor $RS_1$ is inserted and provided on the collector side of the transistor $TR_1$ in FIGURE 1, the protective resistor will have no influence on the normal operating condition and will perform a protective action to prevent damage. This is because, as the protective resistor $RS_2$ is inserted and provided on the collector side of the transistor $TR_3$, the input impedance will not vary and, as it is inserted and provided between the connecting point $P_1$ of the shunt resistor $RB_2$ and the base of the transistor $TR_4$ and the collector of the transistor $TR_3$, the transistor $TR_4$ also will not be influenced by the protective resistor $RS_2$.

Further, in such push-pull circuit, too, as is shown in the embodiment in FIGURE 3, as it is a circuit made by combining the circuits shown in FIGS. 1 and 2, when the protective resistors $RS_3$ and $RS_4$ are inserted in the manner corresponding to the showing in FIGS. 1 and 2, respectively, they will operate the same as is mentioned above and will protect the transistors $TR_5$, $TR_6$, $TR_7$ and $TR_8$.

Figure 5:
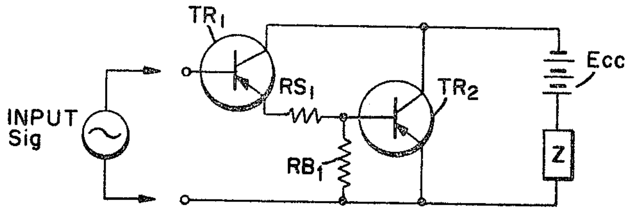

Further, in case it is necessary to make the input impedance higher on the input terminal side, it is suggested to make the following alterations in the circuits of FIGS. 1–3 according to the present invention that:

In the circuit as shown in FIG. 1 before described, it is enough to insert, as shown in FIG. 5 the protective resistor $RS_1$ between emitter of the amplifying transistor $TR_1$ and the junction of the base of the output transistor $TR_2$ and the shunt resistor $RB_1$.

Figure 6:
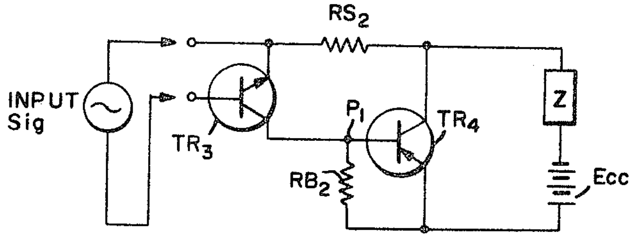

In the circuit as shown in FIG. 2, it is enough to insert, as shown in FIG. 6, the protective resistor $RS_2$ between the emitter of the amplifying transistor $TR_3$ and the collector of the output transistor $TR_4$.

Figure 7:
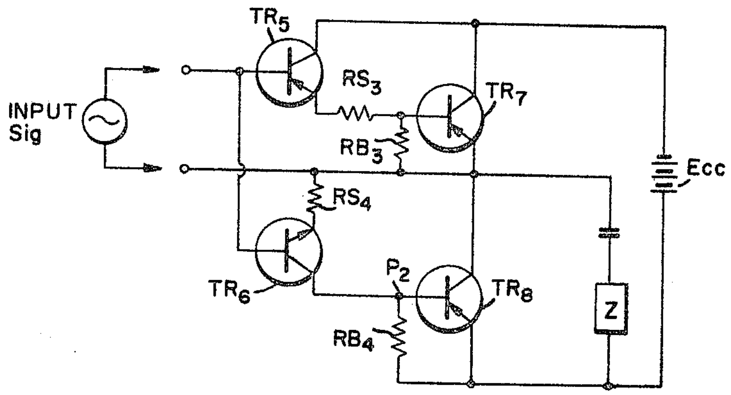

In the circuit as shown in FIG. 3, it is enough to insert, as shown in FIG. 7, the protective resistor $RS_3$ between the emitter of the PNP type amplifying transistor $TR_5$ and the junction of the base of the output transistors $TR_7$ to be connected with said transistor $TR_5$ and the shunt resistor $RB_3$, and to insert the protective resistor $RS_4$ between the emitter of the NPN type amplifying transistor $TR_6$ and the collector of the output transistor $TR_8$ to be connected with said transistor $TR_6$.

The input impedance will be able to be made higher in the circuits as shown in FIGS. 5–7 and yet the protecting action and other operations will be the same as in the before mentioned embodiments shown in FIGS. 1–3.

As the present invention has such operation and formation as are explained above, transistors can be protected and prevented from being damage by an excess input, electric pulse input or load short-circuiting without any influence at all on the normal operation. When it is combined with a conventional temperature compensating circuit system or the like, the operation of the output transistor of the transistor amplifier will be perfectly protected. The range of its utilization is so wide that the present invention is really effective.

What is claimed is:

1. A transistor output stage protecting circuit system in a so-called PNP type Darlington-connected circuit of a fundamental formation in which a load and an electric source are connected in series between the collector and emitter of a PNP type output transistor $TR_2$, the collector of a PNP type amplifying transistor $TR_1$ is connected to the collector of said PNP type output transistor $TR_2$, the emitter of said PNP type amplifying transistor $TR_1$ is connected to the base of said PNP type output transistor $TR_2$, a shunt resistor $RB_1$ is connected between the base and emitter of said PNP type output transistor $TR_2$ and between the base of said PNP type amplifying transistor $TR_1$ and the emitter of said PNP type output transistor $TR_2$ is made an input terminal, the improvement which comprises inserting between the collector of said PNP type amplifying transistor $TR_1$ and the collector of said PNP type output transistor $TR_2$ in said circuit a protective resistor $RS_1$ of such value that the voltage between the emitter and collector of said PNP type amplifying transistor $TR_1$ may be substantially zero when the maximum allowable current flows to said PNP type output transistor $TR_2$ so that said PNP type output transistor $TR_2$ may be prevented from being damaged by any excess current in its abnormal operating state without directly limiting its output current.

2. A transistor output stage protecting circuit system in a so-called NPN type Darlington-connected circuit of a fundamental formation in which a load and an electric source are connected in series between the collector and emitter of a PNP type output transistor $TR_4$, the emitter of an NPN type amplifying transistor $TR_3$ is connected to the collector of said PNP type output transistor $TR_4$, the collector of said NPN type amplifying transistor $TR_3$ is connected to the base of said PNP type output transistor $TR_4$, a shunt resistor $RB_2$ is connected between the base and emitter of said PNP type output transistor $TR_4$ and between the base and emitter of said NPN type amplifying transistor $TR_3$ is made an input terminal, the improvement which comprises inserting between the collector of said NPN type amplifying transistor $TR_3$ and the junction of the base of said PNP type output transistor $TR_4$ and the shunt resistor $RB_2$ in said circuit a protective resistor $RS_2$ of such value that the voltage between the emitter and collector of said NPN type amplifying transistor $TR_3$ may be substantially zero when the maximum allowable current flows to said PNP type output transistor $TR_4$ so that said PNP type output transistor $TR_4$ may be prevented from being damaged by any excess current in its abnormal operating state without directly limiting its output current.

3. A transistor output stage protecting circuit system in a so-called Darlington-connected complementary type output transformerless single-ended push-pull circuit of a fundamental formation in which an electric source is connected between the collector of one $TR_7$ of two PNP type output transistors $TR_7$ and $TR_8$ and the emitter of the other transistor $TR_8$, the collector of said PNP type output transistor $TR_8$ to whose emitter is connected the electric source is connected to the emitter of said PNP type output transistor $TR_7$ to whose collector is connected the electric source, a load is connected through a condenser between the emitter of said PNP type transistor $TR_7$ and the emitter of said PNP type transistor $TR_8$, the collector of a PNP type amplifying transistor $TR_5$ is connected to the collector of said PNP type output transistor $TR_7$, the base of said PNP type output transistor $TR_7$ is connected to the emitter of said PNP type amplifying transistor $TR_5$, a shunt resistor $RB_3$ is connected between the base and emitter of said PNP type output transistor $TR_7$, the emitter of an NPN type amplifying transistor $TR_6$ is connected to the collector of said PNP type output transistor $TR_8$, the base of said PNP type output transistor $TR_8$ is connected to the collector of said NPN type amplifying transistor $TR_6$, a shunt resistor $RB_4$ is connected between the base and emitter of said PNP type output transistor $TR_8$, the base of said NPN type amplifying transistor $TR_6$ is connected to the base of said PNP type amplifying transistor $TR_5$ and between the base of said PNP type amplifying transistor $TR_5$ and the emitter of said PNP type output transistor $TR_7$ is made an input terminal, the improvement which comprises inserting between the collector of said PNP type amplifying transistor $TR_5$ and the collector of said PNP type output transistor $TR_7$ in said circuit a protective resistor $RS_3$ of such value that the voltage between the emitter and collector of said PNP type amplifying transistor $TR_5$ may be substantially zero when the maximum allowable current flows to said PNP type output transistor $TR_7$ and between the collector of said NPN type amplifying transistor $TR_6$ and the junction of the base of said PNP type output transistor $TR_8$ and the shunt resistor $RB_4$ a protective resistor $RS_4$ of such value that the voltage between the emitter and collector of said NPN type amplifying transistor $TR_6$ may be substantially zero when the maximum allowable current flows to said PNP type output transistor $TR_8$ so that said two PNP type output transistors $TR_7$ and $TR_8$ may be prevented from being damaged by any excess current in their abnormal operating state without directly limiting their output current.

4. A transistor output stage protecting circuit system in a so-called PNP type Darlington-connected circuit of a fundamental formation in which a load and an electric source are connected in series between the collector and emitter of a PNP type output transistor $TR_2$, the collector of a PNP type amplifying transistor $TR_1$ is connected to the collector of said PNP type output transistor $TR_2$, the emitter of said PNP type amplifying transistor $TR_1$ is connected to the base of said PNP type output transistor $TR_2$, a shunt resistor $RB_1$ is connected between the base and emitter of said PNP type output transistor $TR_2$ and between the base of said PNP type amplifying transistor $TR_1$ and the emitter of said PNP type output transistor $TR_2$ is made an input terminal, the improvement which comprises inserting between the emitter of said PNP type amplifying transistor $TR_1$ and the junction of the base of said PNP type output transistor $TR_2$ and the shunt resistor $RB_1$ in said circuit a protective resistor $RS_1$ of such value that the voltage between the emitter and collector of said PNP type amplifying transistor $TR_1$ may be substantially zero when the maximum allowable current flows to said PNP type output transistor $TR_2$ so that said PNP type output transistor $TR_2$ may be prevented from being damaged by any excess current in its abnormal operating state without directly limiting its output current.

5. A transistor output stage protecting circuit system in a so-called NPN type Darlington-connected circuit of a fundamental formation in which a load and an electric source are connected in series between the collector and emitter of a PNP type output transistor $TR_4$, the emitter of an NPN type amplifying transistor $TR_3$ is connected to the collector of said PNP type output transistor $TR_4$, the collector of said NPN type amplifying transistor $TR_3$ is connected to the base of said PNP type output transistor $TR_4$, a shunt resistor $RB_2$ is connected between the base and emitter of said PNP type output transistor $TR_4$ and between the base and emitter of said NPN type amplifying transistor $TR_3$ is made an input terminal, the improvement which comprises inserting between the emitter of said NPN type amplifying transistor $TR_3$ and the collector of said PNP type output transistor $TR_4$ in said circuit a protective resistor $RS_2$ of such value that the voltage between the emitter and collector of said NPN type amplifying transistor $TR_3$ may be substantially zero when the maximum allowable current flows to said PNP type output transistor $TR_4$ so that said PNP type output transistor $TR_4$ may be prevented from being damaged by any excess current in its abnormal operating state without directly limiting its output current.

6. A transistor output stage protecting circuit system in a so-called Darlington-connected complementary type output transformerless single-ended push-pull circuit of a fundamental formation in which an electric source is connected between the collector of one $TR_7$ of two PNP type output transistors $TR_7$ and $TR_8$ and the emitter of the other transistor $TR_8$, the collector of said PNP type output transistor $TR_8$ to whose emitter is connected the electric source is connected to the emitter of said PNP type output transistor $TR_7$ to whose collector is connected the electric source, a load is connected through a condenser between the emitter of said PNP type transistor $TR_7$ and the emitter of said PNP type transistor $TR_8$, the collector of a PNP type amplifying transistor $TR_5$ is connected to the collector of said PNP type output transistor $TR_7$, the base of said PNP type output transistor $TR_7$ is connected to the emitter of said PNP type amplifying transistor $TR_5$, a shunt resistor $RB_3$ is connected between the base and emitter of said PNP type output transistor $TR_7$, the emitter of an NPN type amplifying transistor $TR_6$ is connected to the collector of said PNP type output transistor $TR_8$, the base of said PNP type output transistor $TR_8$ is connected to the collector of said NPN type amplifying transistor $TR_6$, a shunt resistor $RB_4$ is connected between the base and emitter of said PNP type output transistor $TR_8$, the base of said NPN type amplifying transistor $TR_6$ is connected to the base of said PNP type amplifying transistor $TR_5$ and between the base of said PNP type amplifying transistor $TR_5$ and the emitter of said PNP type output transistor $TR_7$ is made an input terminal, the improvement which comprises inserting between the emitter of said PNP type amplifying transistor $TR_5$ and the junction of the base of said PNP type output transistor $TR_7$ and the shunt resistor $RB_3$ in said circuit a protective resistor $RS_3$ of such value that the voltage between the emitter and collector of said PNP type amplifying transistor $TR_5$ may be substantially zero when the maximum allowable current flows to said PNP type output transistor $TR_7$, and inserting between the emitter of said NPN type amplifying transistor $TR_6$ and the collector of said PNP type output transistor $TR_8$ a protective resistor $RS_4$ of such value that the voltage between the emitter and collector of said NPN type amplifying transistor $TR_6$ may be substantially zero when the maximum allowable current flows to said PNP type output transistor $TR_8$, so that said two PNP type output transistors $TR_7$ and $TR_8$ may be prevented from being damaged by any excess current in their abnormal operating state without directly limiting their output current.

References Cited

UNITED STATES PATENTS

| | | | |
|---|---|---|---|
| 2,962,665 | 11/1960 | Greatbatch | 330—40 XR |
| 3,042,875 | 7/1962 | Higginbotham | 330—19 XR |
| 3,046,470 | 7/1962 | Blocher | 307—88.5 |
| 3,178,648 | 4/1965 | Tanner | 330—19 |

FOREIGN PATENTS

| | | |
|---|---|---|
| 882,294 | 11/1961 | Great Britain. |

OTHER REFERENCES

Lin, Quasi-Complementary Transistor Amplifier, Electronics, September 1956, pages 173–175. Copy available in 330–17 and Scientific Library.

Transistorized 6 Watt Hi-Fi, Radio-Electronics, August 1957, page 108. Copy available in 330–18 and Scientific Library.

ROY LAKE, *Primary Examiner.*

S. H. GRIMM, F. D. PARIS, *Assistant Examiners.*